United States Patent [19]

Layher et al.

[11] Patent Number: 4,914,813

[45] Date of Patent: Apr. 10, 1990

[54] REFURBISHING OF PRIOR USED LAMINATED CERAMIC PACKAGES

[75] Inventors: Francis W. Layher, Tuscon, Ariz.; Napoleon Fulinara, San Diego, Calif.

[73] Assignee: Innovative Packing Technology, San Diego, Calif.

[21] Appl. No.: 276,238

[22] Filed: Nov. 25, 1988

[51] Int. Cl.$^4$ ............................................... H05K 3/06
[52] U.S. Cl. .................................... 29/843; 29/402.03; 29/402.06; 156/664; 264/61; 437/205
[58] Field of Search .................. 437/205; 29/840, 843, 29/884, 885, 401.1, 402.01, 402.03, 402.04, 402.06, 402.08; 264/61; 156/664

[56] References Cited

U.S. PATENT DOCUMENTS

| | | | |
|---|---|---|---|
| 4,012,832 | 3/1977 | Crane | 437/205 |
| 4,221,047 | 9/1980 | Narken et al. | 29/840 |
| 4,260,451 | 4/1981 | Schmeckenbecher | 156/664 |
| 4,296,456 | 10/1981 | Reid | 361/412 X |
| 4,434,134 | 2/1984 | Darrow et al. | 29/884 X |
| 4,458,291 | 7/1984 | Yanagisawa et al. | 206/328 X |
| 4,504,322 | 3/1985 | Adwalpalker et al. | 29/885 X |
| 4,539,622 | 9/1985 | Akasaki | 264/61 X |
| 4,617,730 | 10/1986 | Geldermans et al. | 29/843 |
| 4,736,276 | 4/1988 | Usaifusa et al. | 264/61 X |
| 4,833,102 | 5/1989 | Byrne et al. | 174/52.3 X |

OTHER PUBLICATIONS

IBM Tech. Discl. Bull., vol. 18, No. 2, Jul. 1975, by M. J. Interrante, p. 413.

Primary Examiner—Carl J. Arbes
Attorney, Agent, or Firm—Frank D. Gilliam

[57] ABSTRACT

The invention is directed to a process for refurbishing of prior used laminated ceramic packages with the example shown as a pin grid array ceramic package which includes a ceramic substrate with a central opening or cavity, a plurality of conductors are embedded therein in one or more layers which have electrical condtinuity from the outer edge thereof to the central opening (this continuity path may extend through one or more layers) and to an equal plurality of conductive pads on the surface of the substrate. The bottom surface of the cavity may be enclosed by a metallic heat sink cover, an electronic chip (die) is adhered by silver glass or other adhering substance to the bottom surface of the cavity and electrically connected via small diameter conductors to the ends of the plurality of embedded conductors adjacent to the central opening, a plurality of pins are physically and conductively attached to each of the conductive pad on the surface of the substrate and a cover attached over the chip for covering the electronic chip and conductors. In effect the laminated ceramic packages assembled as hereinbefore mentioned are precision reverse manufactured or stripped down by specific steps to a bare ceramic substrate and rebuilt to its original configuration for reuse.

10 Claims, 1 Drawing Sheet

U.S. Patent        Apr. 10, 1990        4,914,813
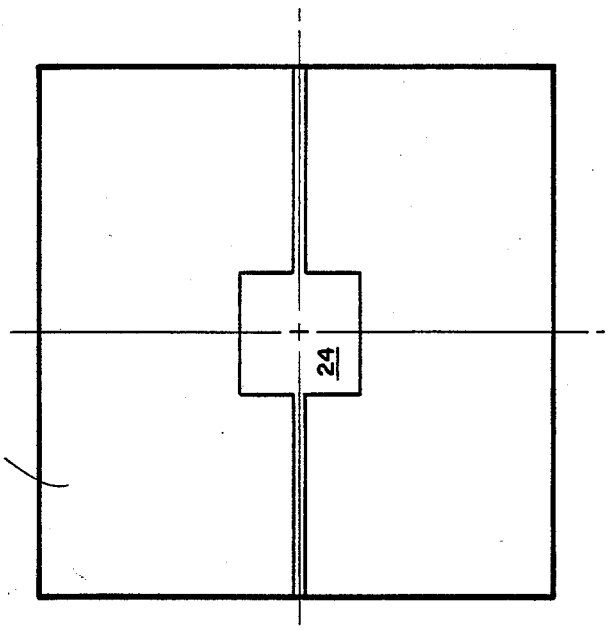
FIGURE 3
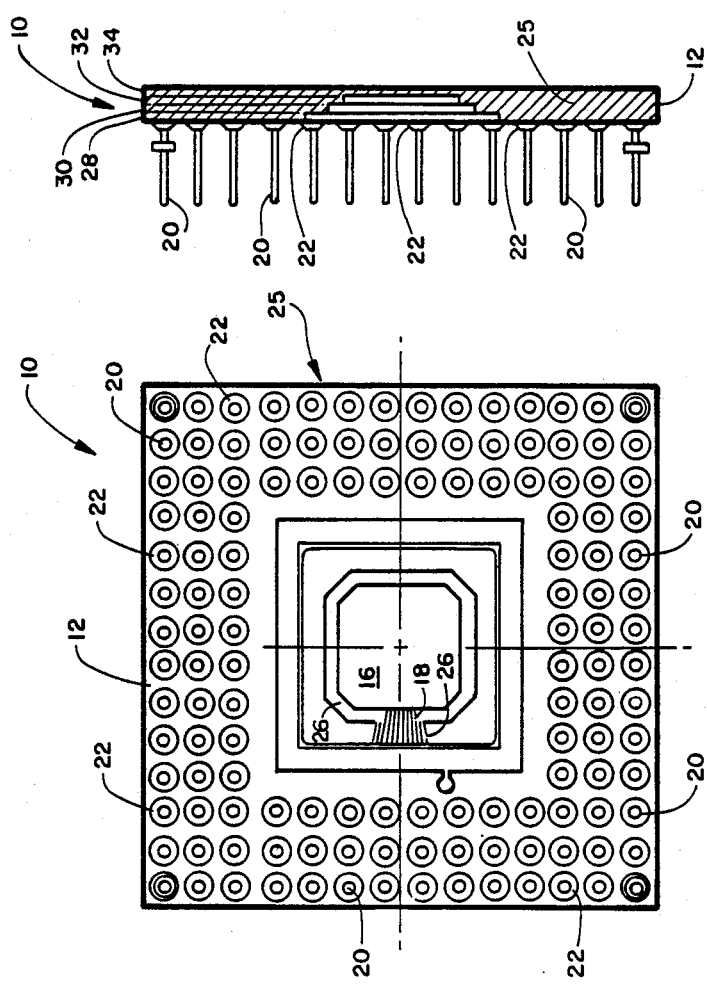
FIGURE 2
FIGURE 1

REFURBISHING OF PRIOR USED LAMINATED CERAMIC PACKAGES

BACKGROUND OF THE INVENTION

The invention is directed to the refurbishing of used ceramic electronic packages for reuse and particularly to the complete reverse manufacturing of laminated ceramic packages which have a plurality of separate layered conductors.

In the present state of the art of manufacturing laminated ceramic packages of which pin grid arrays are an example, and the like about 10% to 20% of the completed packages after adding the semi-conductor device are inoperative for various reasons and have to be discarded as unacceptable for intended use.

Presently there has not been an acceptable method for repairing these used laminated ceramic packages (pin grid arrays) for reuse of the unacceptable substrates contained therein and they are scraped for the recovery value of the precious metals plated thereon.

The economic cost of the substrates are quite high and the resulting high percentage of failure results in an increased cost of the acceptable end product which must necessarily include the cost of the scrapped units.

In order to increase the competitiveness of the use of laminated ceramic packages with other less expensive electronic packages the overall economic cost of laminated ceramic packages must necessarily be reduced to become competitive in the electronic industry. An inexpensive method for the refurbishing of a large percentage of laminated ceramic packages could decrease the necessity of scraping the unacceptable laminated ceramic packages and a very high percentage of those normally scraped packages could be reused.

There is presently no known industry acceptable method of refurbishing unacceptable laminated ceramic packages that do not have a lead frame with a tie bar. A satisfactory method for the refurbishing of salvaged laminated ceramic packages would find immediate acceptance in the electronic package manufacturing art.

SUMMARY OF THE INVENTION

Laminated ceramic packages are packages used to package gate array devices, microcomputers, microprocessors (MPU) and other custom electronic devices. The substrates used to produce the laminated ceramic packages are constructed from ceramics having multi-layers of conductors embedded in dielectric that extend from the outer edge of the substrate through one or more layers from each of a plurality of pads on the surface of the package onto which pins are conductively attached to the individual conductors of one or more dies centrally positioned in a cavity in the package through individual bonding. Many expensive intricate designs have been produced having two hundred or more individual leads and corresponding connector pins and bonding fingers. Present manufacturing process used in the packaging of the semiconductors in the laminate ceramic packages results in a considerable number of unusable units. The units are unusable for various reasons either electronic or mechanical and the unusable laminate ceramic packages are about 10% to 20% of those manufactured. As can be understood, a yield of from 80% to 90% results in a considerable economic waste. Presently the unusable laminate ceramic packages are scrapped and any precious metals plated thereon is salvaged after pulverizing. The ceramic substrate remains are then discarded as waste. The present invention is directed to the remanufacturing of the laminate ceramic packages wherein the precious metals plated thereon are salvaged and the ceramic substrate is also salvaged so that it can be reused in the manufacturing of laminated ceramic packages.

The remanufacturing process comprises a number of steps which are in effect reverse manufacturing of the ceramic package and then the remanufacturing of the substrate to a condition for reuse. The following steps are performed in the remanufacturing of a typical laminated ceramic package known as a pin grid array package:

1. The lid and die or chip is removed from the package.
2. The die attached adhesive, wires, pins, nickel and gold are removed.
3. The metal components such as, the pin pads and bonding fingers are electroless plated.
4. Pins are brazed to the pin pads of the substrate.
5. Conductive material is applied to the outer edges or side surfaces of the ceramic substrate for interconnecting the outer ends of all of the conductive layers together to provide a common conductor for electroplating.
6. The metal components of the ceramic substrate are then nickel and gold plated by using the now common connector as one of the plating electrodes.
7. The edge or side conductive material is then removed restoring the individual separately conductors to their pre edge masking state.
8. The substrate is now ready to be returned to the pin grid package manufacturing process.

An object of this invention is to inexpensively reprocess the ceramic substrate from a failed and unusable pin grid array package for reuse.

Another object of the invention is to connect all of the embedded connectors within the package together so that a common conductor is provided for the plating step.

This and other objects and advantages of the invention will become obvious to those familiar with the pin grid array package art when the following drawing Figures are viewed while reading the specification.

BRIEF DESCRIPTION OF THE DRAWING FIGURE

FIG. 1 is a plan view showing depicting a typical laminated ceramic package;

FIG. 2 is an end view showing of the laminated ceramic package of FIG. 1; and

FIG. 3 is a showing of the back of the substrate with a heat sink installed in the bottom of the center cavity.

DETAILED DESCRIPTION OF THE PREFERRED PROCESS OF THE INVENTION

Referring now to drawing FIGS. 1 through 3, the invention is directed to the process of the remanufacturing of laminate ceramic packages 10 for the salvage and eventual reuse of the ceramic substrates 12 from which the laminate ceramic packages are formed. The following discussion is directed specifically to pin grid arrays which is a commonly known laminate ceramic package. The description is not intended to be limiting in scope as the process herein is applicable to all type of laminate ceramic packages that do not have a lead frame with a common conductor.

The process includes the following steps:

First the lid not shown and die 16 are removed from the rejected pin grid array package 10 by heating a heating block (not shown) to about 400° C., preheating the unusable pin grid array on the heating block, remove the lid and die 16 by a slight prying from the attached surface as required, remove as much of the glass or other material used to attach the lid and die as possible by scraping or other means and let the package cool to room temperature.

The braze, eutectic or silver glass, used for adhering the lid and die, fine wires 18, pins 20, nickel plate and gold plate is then removed from the metal components by the following steps:

First the substrate is soaked in TECHNISTRIP or an equivalent suitable stripper until substantially all of the above has been stripped or removed from the metal components, the substrate is then rinsed in deionized (DI) water, then dried. It should be understood that some laminated ceramic packages can be processed with just the silver glass and gold plating removed by first using acetic acid to dissolve the silver glass die attachment. The gold plating and some or all of the nickel is then removed using Technistrip without removing to much of the braze holding down the pins 20. Also, in some instances when the package is used for wire bonder set up, the pins may not be required.

A electroless gold or flash plate is then performed by the following steps:

First the parts are soaked in an alkaline cleaner such as CP-132 or an equivalent cleaner, the substrate is then rinsed in DI water, the substrate is then soaked in 10% potassium hydroxide, immersed in electroless gold solution to plate from 5 to 10 micro inches of gold on the metal components, the substrate is then rinsed in DI water and dried.

In place of the gold plate noted above, the substrate can be immersed in a palladium activator solution, heated to about 90° C. for at least two minutes.

The metal components are then electroless nickel plated in the following manner:

First the substrate is soaked in alkaline cleaner CF-132 or equivalent while being ultrasonically vibrated, rinsed in DI water, then immersed in a 50% hydrochloric acid (HCL) for at least 1 minute, rinsed in DI water, rinsed in DI water, then immersed in electroless nickel solution sufficiently to plate thirty micro inches of nickel on the metal components, then rinsed in DI water and dried, the substrate is then sintered in a furnace having a reductive atmosphere by elevating its temperature to about 800° C. The above process is then repeated.

The pins 20 which were removed during stripping are then replaced and attached to the surface of the substrate in alignment with the conductive pads 22 which are on the ends of conductive leads that extend from the side edge 25 to the central opening 24 of the substrate for wire bonds by the following steps: the substrate is placed into a brazing fixture which includes a pin fixture (not shown) which holds the pins 20 to be replaced in alignment with the pads 22 to which they are to be attached, position a pin and a brazing sphere in the opening in the fixture, place the substrate and fixture in a brazing furnace with a reducing atmosphere and raise the temperature to 800° C. whereupon the braze sphere will melt and wet both the pads and pins. Upon reaching 800° C., the substrate is then removed from the furnace and cooled to ambient temperature and the fixture is then removed from the substrate.

The side edges 25 of the substrate are then coated with a metallic material for conductively tying together the conductive layers 28, 30, 32 and 34 (some substrates have more conductive layers while some have less) of the substrate for plating by the following steps: The substrate may require a slight manual sanding of the surface to expose the Tungsten or other co-fired metalization pads adequately, soaked in an alkaline cleaner CP-132 or equivalent while being ultrasonically vibrated, rinse in DI water and dry the substrate, then one side (edge) 25 of the substrate is precisely dipped or otherwise coated at a time in a conductive material such as, but not limited to, flaked silver in an acrylic resin and solvent or metal loaded epoxy in a manner so as not to smear the substrate surface, place the substrate in an oven at 130°-140° C. for about 60 minutes, (it should be understood that this time could vary from 0 time for conductive tape or two part epoxy to higher temperatures for longer times for fired on material such as, thick film copper or silver) remove the substrate from the furnace and check for continuity between the bonding fingers 26 and pin outs (pads) 22.

The metal components of the substrate are then plated according to the following steps: The parts are placed on a commercial plating rack, soaked in a 50% HCL solution, rinsed in DI water, placed in nickel strike, Ni Plating solution with the now common electrically conductors in the package used as one electrode and the solution as the other according to a predetermined plating DC current setting and solution temperature, rinsed in DI water, placed in gold plating solution with the specific plating DC current setting for a specified length of time and inspect for proper nickel and gold plate thickness.

The conductive side or edge material is then removed to separate or remove the conductive short between the individual conductive layers. When using the silver acrylic system the removal is accomplished by the following steps:

Scrape or otherwise remove the bulk of the conductive material from the sides or edges, remove any conductive residue, by way of example, by carefully manually sanding the sides or edges or other suitable means, the substrate is soaked in an isopropyl alcohol or other solvent for dissolving the acrylic while being agitated until all side masking is totally removed, then rinsed in hot DI water and rinsed in isopropyl alcohol and allowed to dry.

After the process is completed the pin grid array can be reused to package a semiconductor for which it was intended as when originally produced.

The process of the invention allows for the refurbishing of pin grid arrays normally salvaged for precious metal value only and then destroyed.

What is claimed is:

1. A process for remanufacturing of the ceramic substrates used for the packaging of semiconductor devices recovered from laminated ceramic packages which have failed to properly operate after the manufacturing process is complete, said laminate ceramic packages include one or more layers of conductors each of which have continuity from the outer edge of the substrate to one of a plurality of bonding fingers located at a central opening in said substrate, a lid adhered to the surface of the substrate sealing over said central opening, a die interconnected by thin wires to said bonding fingers and said die being adhered to a surface covering the bottom of said central opening, a plurality of connector pins braze bonded to metal pads on the outer surface of said substrate each being connected to a separate one of said plurality of conductors, said bonding fingers, pads and pin are first nickel plated and then plated with gold, said lid and pins are adhered by suitable bonding material said remanufacturing comprising the steps of:

unsealing and removing of said lid;
removing said die;
removing said bonding material, pins, wires, gold and nickel from said substrate;
replating said bonding fingers and pads with a material selected from a group consisting of electrodes gold or palladium activator;
replating said bonding fingers and pads with electroless nickel;
firing said substrate to densify Ni;
aligning and brazing one of said pins to each of said pads;
interconnecting all of said conductors together by applying a conductive material to the outer edges of said substrate to provide a conductor electrically common to said bonding fingers, pads and pins;
plating the bonding fingers, pads and pins with nickel;
plating the bonding fingers, pads and pins with gold; and
disconnecting said conductors form each other.

2. The invention as defined in claim 1 wherein said unsealing and removing said lid and removing said die comprising the steps of heating the said laminate ceramic package to a temperature to at least 400° C., applying pressure between said lid and said substrate and between said die and said substrate until separation occurs.

3. The invention as defined in claim 1 wherein the steps of removing said bonding material, pins, wires, gold and nickel plate from said substrate comprises the steps of soaking the substrate in a stripper solution, rinsing in DI water, soaking the substrate in a 10% potassium hydroxide solution, rinsing in DI water, immersing said substrate in said material selected from the group consisting of electroless gold solution or palladium activator, plating 5 to 10 micro inches of the selected material on said substrate, rinsing said substrate in DI water.

4. The invention as defined in claim 1 wherein said step of plating said bonding fingers, pads and pins with said material selected from the group consisting of electroless gold or palladium activator comprises the steps of soaking said substrate in an alkaline cleaner while vibrating said substrate ultrasonically, rinsing said substrate in DL water, soaking said substrate in a 10% potassium hydroxide solution, immersing said substrate in said material, leaving said substrate in said selected material solution until a plating of from 5 to 10 micro inches of said selected material is plated on said bonding fingers, pads and pins and rinsing in DI water.

5. The invention as defined in claim 1 wherein said plating of said bonding fingers, pads and pins with electroless nickel comprises the steps of soaking said substrate in an alkaline solution while vibrating said substrate ultrasonically, rinsing said substrate in DI water, immersing said substrate in an palladium activator solution heated to approximately 90 C. for approximately 1 minute, rinsing said substrate in DI water, immersing said substrate in an electroless nickel solution until approximately 30 micro inches are deposited on said bonding fingers, pads and pins, rinsing said substrate in DI water, sintering said substrate by elevating its temperature in a reducing atmosphere to approximately 800 C. and repeating the above steps.

6. The invention as defined in claim 1 wherein said step of aligning and brazing said pins to said pads comprises the steps of placing said substrate in a brazing fixture having a aperture in the back thereof, aligning each of said pins with each of said pads on said substrate, placing said fixture, substrate and pins into a brazing furnace with a reducing atmosphere and elevating their temperature to approximately 800 C.° and removing the fixture and substrate with pins now brazed thereto from said furnace.

7. The method according to claim 1 wherein the step of interconnecting the plurality of conductors comprises coating the edges of said substrate with a removable electrically conductive material.

8. In invention as defined in claim 7 wherein said electrically conductive material is metallic.

9. The invention as defined in claim 7 wherein said electrically conductive material is a silver acrylic mixture.

10. In a method of remanufacturing a ceramic package including a ceramic substrate having a plurality of individual conductors embedded in at least one layer therein each of which conduct from the outer edge surface thereof to a bonding finger located at a central opening in said substrate for connection to a die, each of said conductors having a package surface exposed pad thereon for the connection of a pin thereto, a method for interconnecting said individual conductors which are intentionally separated electrically after the package is originally electroplated prior to use of the substrate in the package manufacturing process together for electroplating comprising:

applying a selectively removable conductive material to said outer edge of said preused ceramic package whereby the plurality of now separated conductive paths running through the package from said outer edge to a bonding finger at a central opening in said substrate are interconnected to form a common electrical conductive path for electro plating.

* * * * *